(12) United States Patent
Comesaña

(10) Patent No.: US 10,632,855 B2
(45) Date of Patent: Apr. 28, 2020

(54) DEVICE AND METHOD FOR MEASURING ISOLATION RESISTANCE OF BATTERY POWERED SYSTEMS

(71) Applicant: FICO TRIAD, S.A., Barcelona (ES)

(72) Inventor: Pablo Fernández Comesaña, Sabadell (ES)

(73) Assignee: FICO TRIAD, S.A., Barcelona (ES)

( * ) Notice: Subject to any disclaimer, the term of this patent is extended or adjusted under 35 U.S.C. 154(b) by 123 days.

(21) Appl. No.: 15/891,948

(22) Filed: Feb. 8, 2018

(65) Prior Publication Data
US 2018/0222342 A1  Aug. 9, 2018

(30) Foreign Application Priority Data

Feb. 8, 2017 (EP) ..................................... 17382055

(51) Int. Cl.
*B60L 11/18* (2006.01)
*B60L 3/00* (2019.01)
(Continued)

(52) U.S. Cl.
CPC ......... *B60L 11/1851* (2013.01); *B60L 3/0069* (2013.01); *B60L 3/12* (2013.01); *B60L 58/10* (2019.02); *G01R 27/025* (2013.01); *G01R 31/025* (2013.01); *B60Y 2200/91* (2013.01); *G01R 31/006* (2013.01); *Y02T 10/705* (2013.01); *Y02T 10/7005* (2013.01)

(58) Field of Classification Search
None
See application file for complete search history.

(56) References Cited

U.S. PATENT DOCUMENTS

2013/0314097 A1 * 11/2013 Hausberger ........... B60L 3/0069
324/503
2014/0159908 A1 * 6/2014 Hong ................... G01R 31/025
340/636.1
(Continued)

FOREIGN PATENT DOCUMENTS

| EP | 3361271 A1 * | 8/2018 | ........... G01R 27/025 |
| WO | WO-2012036498 A2 * | 3/2012 | ........... G01R 27/025 |
| WO | WO-2013151355 A1 * | 10/2013 | ........... G01R 31/025 |

*Primary Examiner* — Paresh Patel
(74) *Attorney, Agent, or Firm* — Cantor Colburn LLP

(57) ABSTRACT

The present invention refers to a device and a method for measuring isolation resistance of a battery powered systems. The device comprises: a first reference resistance (R01) connectable in series between a positive high-voltage bus (1) and a low-voltage ground connection (5), a second reference resistance (R02) connectable in series between the negative high-voltage bus (2) and the a low-voltage ground connection (5), a first measurement resistance (Rbottom) connected with the low-voltage ground connection (5), a second measurement resistance (Rtop1) connectable in series between the positive high-voltage bus (1), and the first measurement resistance (Rbottom), and a third measurement resistance (Rtop2) connectable in series between the negative high-voltage bus (2), and the first measurement resistance (Rbottom). Isolation resistances (Riso_pos, Riso_neg) are calculated based on voltage measurements at the first measurement resistance (Rbottom), and the mean value of the four high-voltage battery voltage measurements.

16 Claims, 3 Drawing Sheets

(51) Int. Cl.
*B60L 3/12*    (2006.01)
*G01R 27/02*   (2006.01)
*G01R 31/02*   (2006.01)
*B60L 58/10*   (2019.01)
*G01R 31/00*   (2006.01)

(56) References Cited

U.S. PATENT DOCUMENTS

2015/0333378 A1* 11/2015 Chang ............... B60L 50/66
                                                429/50
2016/0096433 A1*  4/2016 Gale ................ G01R 27/025
                                                701/31.9
2016/0258993 A1*  9/2016 Bagchi .............. G01R 31/025

* cited by examiner

DEVICE AND METHOD FOR MEASURING ISOLATION RESISTANCE OF BATTERY POWERED SYSTEMS

CROSS REFERENCE TO RELATED APPLICATIONS

This application claims the benefit of European Application No. 17382055.6 filed Feb. 8, 2017, which is incorporated herein by reference in its entirety.

BACKGROUND

The present disclosure refers in general to electric and/or hybrid vehicles. More specifically, the disclosure relates to a device and a method for measuring isolation resistance of battery powered systems, preferably applicable for measuring isolation or leakage resistance in electric vehicles and/or hybrid vehicles.

An object of the invention is to provide effective isolation resistance measurements, with high accuracy regardless of battery voltage variations.

Electric and hybrid vehicles include high-voltage batteries, typically with a nominal voltage within the range 300-600 volts, that are used to power an electrical motor.

The high-voltage battery is electrically insulated from the body of the vehicle, that is, the vehicle chassis, whereas the negative battery pole in the low-voltage system of the vehicle is connected to chassis ground as is common in vehicles.

It is desirable to keep the two voltage systems separated, and to keep the high-voltage system electrically isolated from chassis ground. In order to detect faults in the high-voltage system, such as an isolation fault, the insulation of the high-voltage system may be continuously monitored to detect leakages in the high-voltage insulation.

Many conventional power systems utilize some means to protect the system against faults, such as line-to-line and line-to-ground faults.

A known method for measuring isolation resistances, is described in the US Standard FMVSS 305: Electric powered vehicles. Electrolyte spillage and electrical shock protection; 11 Sep. 2008. However, the accuracy of the system described in that standard does not consider a measurement circuit to calculate the isolation resistances, and the accuracy of the system is not satisfactory. In addition the system described in that Standard does not consider voltage variations of the high-voltage DC source.

Therefore, there is the need in this technical field, to improve accuracy in the isolation resistance measurements and regardless of battery voltage variations.

SUMMARY

An aspect of the invention refers to a device including a circuit for measuring isolation or leakage resistance of a high-voltage battery powered system, typically with a battery nominal voltage within the range 400-600 volts. The device comprises a positive high-voltage bus and a negative high-voltage bus, both connectable respectively with the positive and negative poles of the battery, and also connectable with a load, so that the battery power is supplied to the load through the high-voltage busses.

The device further comprises a low-voltage ground connection which is the system ground, for example a vehicle chassis.

The device further comprises a first reference resistance of a known value, which is connectable via a first switch between the positive high-voltage bus and the low-voltage ground connection, and a second reference resistance of a known value connectable via a second switch between the negative high-voltage bus and the low-voltage ground connection. Preferably, first and second resistances have the same resistive value.

The device additionally includes a measurement circuit which comprises: a first measurement resistance having a first terminal connected with the low-voltage ground connection, a second measurement resistance connectable via a third switch between the positive high-voltage bus and the second terminal of the first measurement resistance, and a third measurement resistance connectable via a fourth switch between the negative high-voltage bus and the second terminal of the first measurement resistance. Preferably, second and third measurement resistances are high precision resistances, and both have the same resistive value.

The device further comprises a control module adapted for operating the switches, that is, for opening and closing the first to the fourth switches, in accordance with a pre-established measurement sequence.

A calculating module of the device is adapted for calculating an isolation resistance between the positive high-voltage bus and the low-voltage ground, and an isolation resistance between the negative high-voltage bus and the low-voltage ground, based on voltage measurements at the first measurement resistance, and based on voltage measurements at the high-voltage battery.

Another object of the invention is an electric vehicle incorporating a device as the one previously described. The vehicle conventionally comprises a battery and a load, so that the positive high-voltage and negative high-voltage busses, are connected with the battery and with the load. The low-voltage ground is the vehicle chassis. In some implementations of the invention the load is a DC-AC inverter. Alternatively, the load may consist in a battery to be charged in a battery charging system.

Another aspect of the invention refers to a method for measuring isolation resistance of a battery powered system, the battery powered system comprising: a battery, a load, and a positive high-voltage bus and a negative high-voltage bus connected between the battery and the load, and a low-voltage ground connection, wherein the method comprises the steps of:

in a first measurement position, connecting a first and a second measurement resistance in series between the positive high-voltage bus and a low-voltage ground connection, and measuring voltage at the first measuring resistance, and voltage of the high-voltage battery;

in a second measurement position, additionally connecting a first reference resistance between the positive high-voltage bus and the low-voltage ground connection, and measuring voltage at the first measuring resistance, and voltage of the high-voltage battery;

in a third measurement position, connecting a first and a third measurement resistance in series between the negative high-voltage bus and a low-voltage ground connection, and measuring voltage at the first measuring resistance, and voltage of the high-voltage battery;

in a fourth measurement position, additionally to the third measurement position, connecting a second reference resistance between the negative high-voltage bus and the low-voltage ground connection, and measuring voltage at the first measuring resistance, and voltage of the high-voltage battery.

The isolation resistances between the positive high-voltage bus and the low voltage ground, and an isolation resistance between the negative high-voltage bus and the a low-voltage ground, are calculated based on voltage measurements at the first measurement resistance, and voltage measurements of the high-voltage battery. In particular, the method comprises the step of calculating the mean value of the four positive high-voltage battery voltage measurements taken in the above described four measurements positions.

The foregoing features and elements may be combined in various combinations without exclusivity, unless expressly indicated otherwise. These features and elements as well as the operation thereof will become more apparent in light of the following description and the accompanying drawings. However, it should be understood that the following description and drawings are intended to be exemplary in nature and non-limiting.

BRIEF DESCRIPTION OF THE DRAWINGS

Various features will become apparent to those skilled in the art from the following detailed description of the disclosed, non-limiting, embodiments. The drawings that accompany the detailed description can be briefly described as follows.

DETAILED DESCRIPTION

Figure 1:
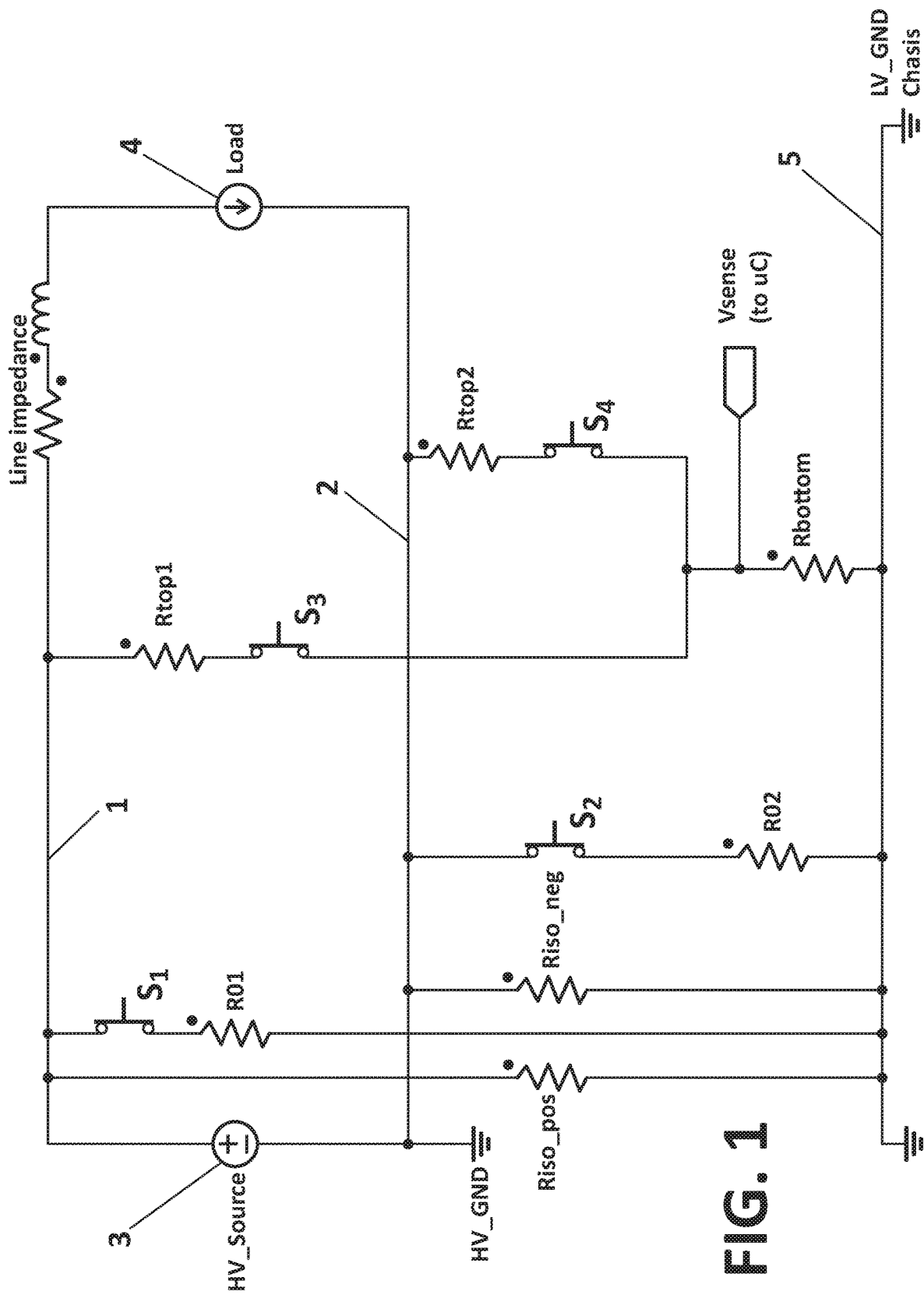
FIG. 1.—is an electric diagram of a preferred embodiment of the invention.

One, non-limiting, embodiment of the present disclosure is shown in FIG. 1, wherein it can be observed that the device comprises a positive high-voltage bus (1) connected with a positive pole of a battery (3) and additionally connected with a load (4). In turn, a negative high-voltage bus (2), which is the ground reference of the high-voltage circuit, is connected with a negative pole of the battery (3) and connected with another terminal of the load (4).

A first reference resistance (R01) is connected in series with a first switch (S1), and both components in series are connected between the positive high-voltage bus (1) and a low-voltage ground connection (5), for example a vehicle chassis. Similarly, a second reference resistance (R02) is connected in series with a second switch (S2), and both components in series are connected between the negative high-voltage bus (1) and the low-voltage ground connection (5).

Furthermore, a first measurement resistance (Rbottom) has a first terminal connected with the low-voltage ground connection (5). A second measurement resistance (Rtop1) and a third switch (S3) are connected in series between the positive high-voltage bus (1), and the second terminal of the first measurement resistance (Rbottom). A third measurement resistance (Rtop2) and a fourth switch (S4) are both connected in series between the negative high-voltage bus (2), and the second terminal of the first measurement resistance (Rbottom).

The device includes a control module adapted for opening and closing the first to the fourth switches (S1-S4) in accordance with a pre-established measurement sequence.

In the first measurement position, the first switch (S1) is open, the second switch (S2) is open, the third switch (S3) is closed, and the fourth switch (S4) is open.

In the second measurement position, the first switch (S1) is closed, the second switch (S2) is open, the third switch (S3) is closed, and the fourth switch (S4) is open.

In the third measurement position, the first switch (S1) is open, the second switch (S2) is open, the third switch (S3) is open, and the fourth switch (S4) is closed.

In the fourth measurement position, the first switch (S1) is open, the second switch (S2) is closed, the third switch (S3) is open, and the fourth switch (S4) is closed.

The device further comprises a first voltage measurement device (not shown) connected for taking voltage measures at the first measuring resistance (Rbottom), and a second voltage measurement device (not shown) connected for measuring the voltage of the high-voltage battery (3).

A calculating module (not shown) of the device, is communicated with the first and second voltage measuring devices, and it is adapted to measure and store, voltage measurements taken at the first measuring resistance (Rbottom), and voltage measurements taken of the high-voltage battery (3), in each one of the above-mentioned four measurement positions. The calculating module is additionally adapted to calculate the mean value of the four high-voltage battery (3) voltage measurements taken in measurements positions one to four.

The calculating module calculates the isolation resistances of the battery powered system in according with the following formulas:

$$\text{Riso\_pos} = \frac{R0 \cdot Rbottom \cdot |V1 - V1p|}{(Rtop + Rbottom) \cdot V1 \cdot V1p} \cdot V\_HV\_mean$$

$$\text{Riso\_neg} = \frac{R0 \cdot Rbottom \cdot |V2 - V2p|}{(Rtop + Rbottom) \cdot V2 \cdot V2p} \cdot V\_HV\_mean$$

Wherein:

V_HV_mean is the mean value of the four high-voltage battery (3) voltage measurements taken respectively in each one of the four measurements positions, V2 is the voltage at the first measuring resistance (Rbottom) measured at the first measuring position, V2p is the voltage at the first measuring resistance (Rbottom) measured at the second measuring position, V1 is the voltage at the first measuring resistance (Rbottom) measured at the third measuring position, V1p is the voltage at the first measuring resistance (Rbottom) measured at the fourth measuring position.

Therefore, the calculating module is adapted for calculating an isolation resistance (Riso_pos) between the positive high-voltage bus (1) and the low-voltage ground (5), and an isolation resistance (Riso_neg) between the negative high-voltage bus and the a low-voltage ground, based on voltage measurements at the first measurement resistance (Rbottom), and based on voltage measurements of the high-voltage battery (3).

The control and the calculating modules are implemented with an electronic programmable device, for example a micro-controller, adapted, that is, programmed to carry out the functions previously described.

The method of the invention is also illustrated in FIG. 1, and comprises the following steps:

In a first measurement position, connecting a first and a second measurement resistances (Rbottom, Rtop1) in series between the positive high-voltage bus (1) and a low-voltage ground connection (5), and measuring voltage at the first measuring resistance (Rbottom), and voltage of the high-voltage battery (3).

In a second measurement position, maintaining first and second measurement resistances (Rbottom, Rtop1) connected, and additionally connecting a first reference resistance (R01) between the positive high-voltage bus (1) and the low-voltage ground connection (5), and measuring voltage at the first measuring resistance (Rbottom), and voltage of the high-voltage battery (3).

In a third measurement position, connecting a first and a third measurement resistances (Rbottom, Rtop2) in series between the negative high-voltage bus (2) and a low-voltage ground connection (5), and measuring voltage at the first measuring resistance (Rbottom), and voltage of the positive high-voltage battery (3).

In a fourth measurement position, maintaining first and third measurement resistances (Rbottom, Rtop2) connected, and additionally connecting a second reference resistance (R02) between the negative high-voltage bus (1) and the low-voltage ground connection (5), and measuring voltage at the first measuring resistance (Rbottom), and voltage of the positive high-voltage battery (3).

The method further comprises the step of calculating the mean value of the four high-voltage battery (3) voltage measurements, taken in the four measurements positions, and calculating the isolation resistances (Riso_pos, Riso_neg) of the battery powered system in according with the above formulas Riso_pos, and Riso_neg.

The value of the first and second reference resistances (R01, R02) is calculated for each particular application, to improve accuracy in the range of the desired measures of the isolation resistances, as well as the expected battery voltage variations. Preferably, first and second reference resistances (R01, R02) have the same resistive value.

Figure 2:
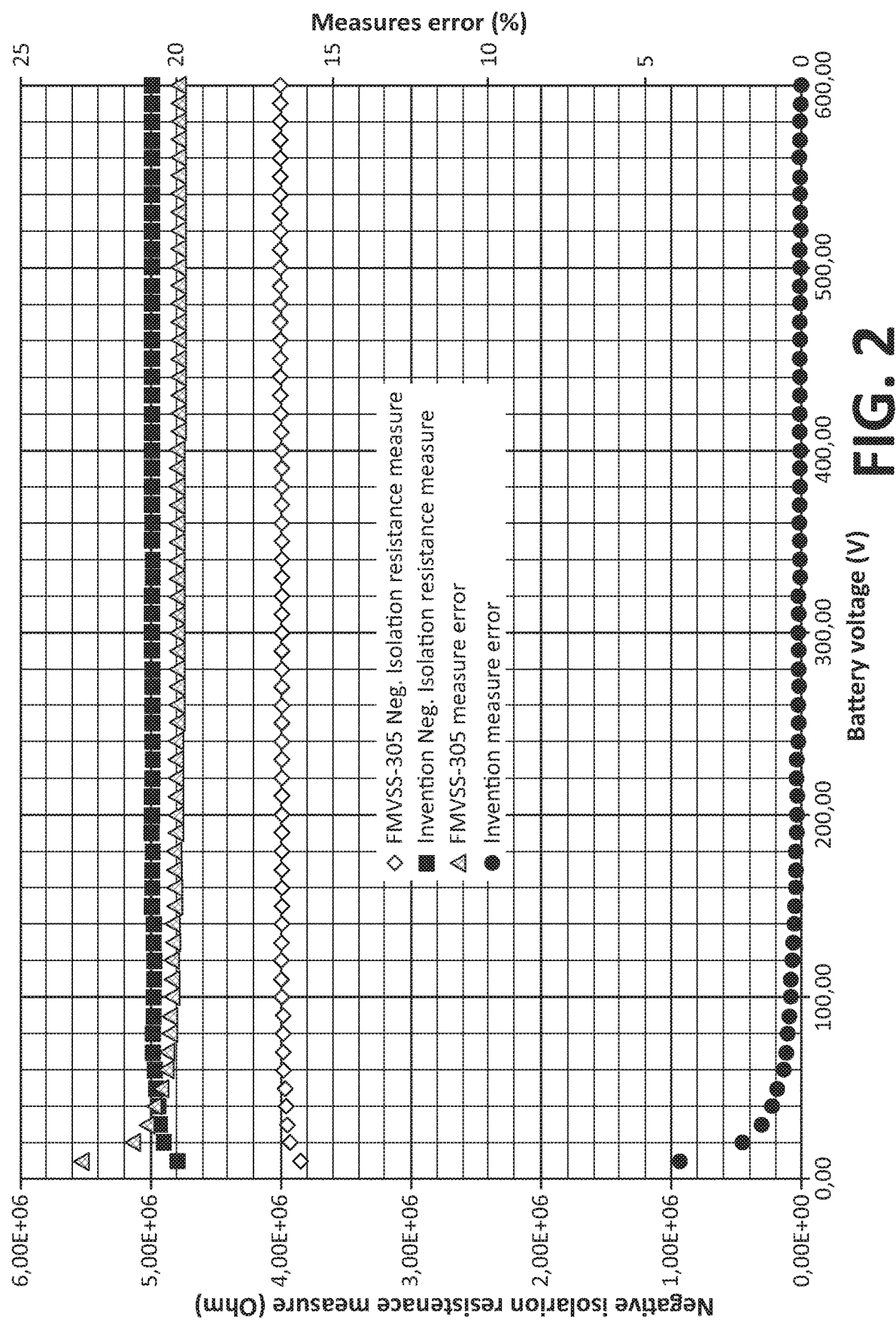
FIG. 2.—is a graph comparing the accuracy of the present invention with respect to prior art techniques.
Figure 3:
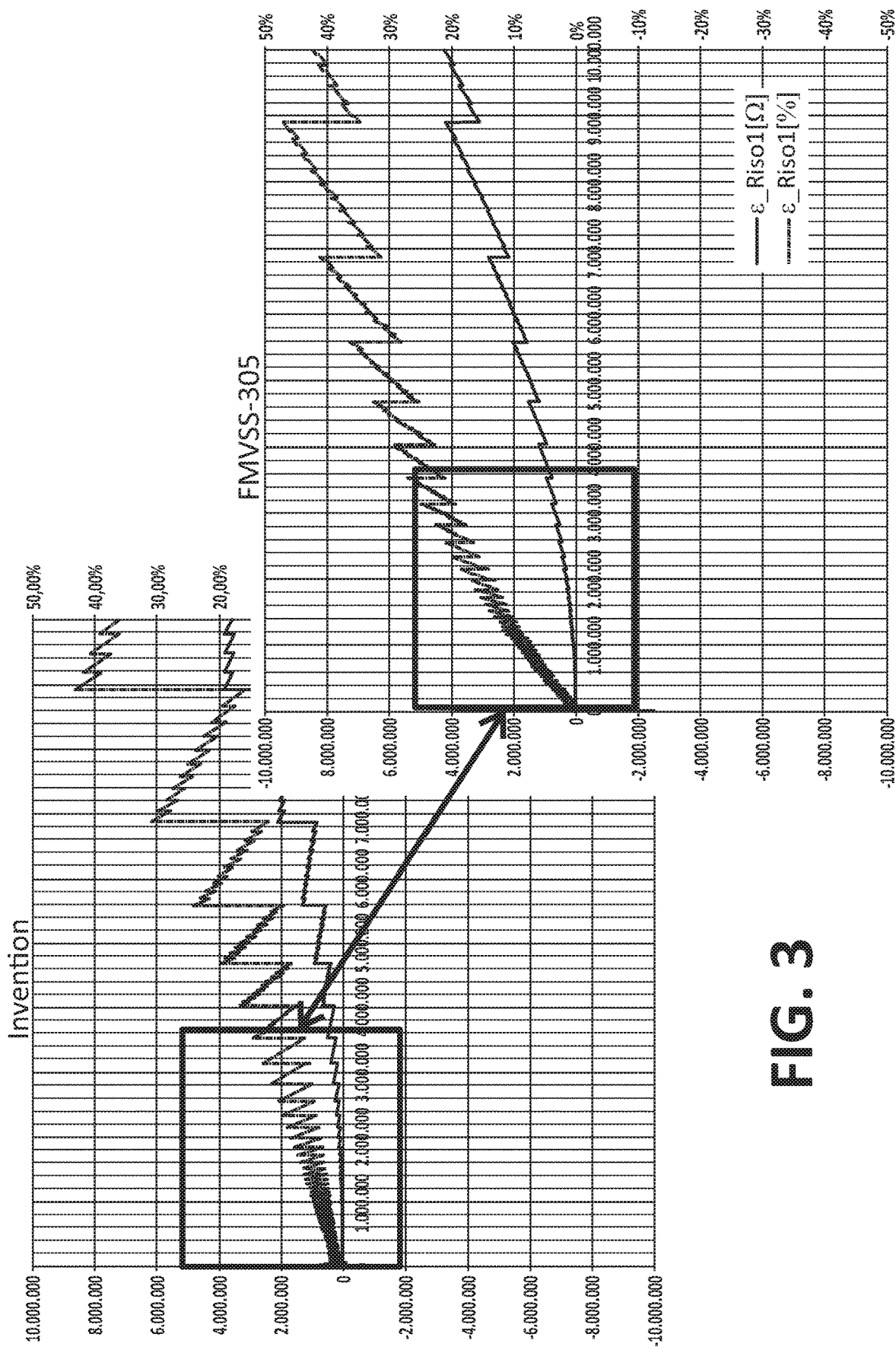
FIG. 3.—is another graph comparing measuring errors for different isolation resistances, using the technique of the invention and the US Standard FMVSS 305, for a constant battery voltage of 450V and R01=R02=200 kohm.

The high-accuracy of the invention compared with the US Standard FMVSS-305 (with a battery nominal voltage of 450 volts), is shown in FIG. 2. Considering a Riso_neg constant value of 5 Mohm, and a R01=R02=500 kohm.

In the following two simulations shows the accuracy of the invention with a battery voltage varying during the measures (V2, V2p, V1 and V1p):

Simulation 1.:
Data: Battery nominal voltage=450 V; R01=R02=500 kohm; Positive isolation resistance (Riso_pos)=500 kohm, Negative Isolation resistance (Riso_neg)=1 Mohm.
Voltage in each of the four measurements:
measurement 1: 450 V; measurement 2: 455V; measurement 3: 460 V; measurement 4: 465 V.
Negative isolation resistance (Riso_neg) according to the invention: 0.99 Mohm.
Negative isolation resistance (Riso_neg) according to the Standard FMVSS-305: 1.19 Mohm.
Error with the invention: 1.17%
Error with the Standard FMVSS-305: 18.68%.
Simulation 2.:
Data: Battery nominal voltage=450 V; R01R02=500 Kohm; Positive isolation resistance (Riso_pos)=1 Mohm, Negative Isolation resistance (Riso_neg)=2 Mohm.
Voltage in each of the four measurements:
measurement 1: 450 V; measurement 2: 440V; measurement 3: 450 V; measurement 4: 460 V.
Positive isolation resistance (Riso_pos) according to the invention: 0.96 Mohm.
Positive isolation resistance (Riso_pos) according to the Standard FMVSS-305: 1.15 Mohm.
Error with the invention: 3.91%
Error with the Standard FMVSS-305: 15.24%.

While the present disclosure is described with reference to the figures, it will be understood by those skilled in the art that various changes may be made and equivalents may be substituted without departing from the spirit and scope of the present disclosure. In addition, various modifications may be applied to adapt the teachings of the present disclosure to particular situations, applications, and/or materials, without departing from the essential scope thereof. The present disclosure is thus not limited to the particular examples disclosed herein, but includes all embodiments falling within the scope of the appended claims.

The invention claimed is:

1. A device for measuring isolation resistance of a battery powered system, the device comprising:
   a positive high-voltage bus connectable to a positive pole of a battery, and additionally connectable to a load;
   a negative high-voltage bus connectable to a negative pole of the battery, and additionally connectable to the load;
   a low-voltage ground connection;
   a first reference resistance and a first switch connected in series between the positive high-voltage bus and the low-voltage ground connection;
   a second reference resistance and a second switch connected in series between the negative high-voltage bus and the low-voltage ground connection;
   a first measurement resistance having a first terminal connected with the low-voltage ground connection and a second terminal;
   a second measurement resistance and a third switch connected in series between the positive high-voltage bus, and the second terminal;
   a third measurement resistance and a fourth switch connected in series between the negative high-voltage bus, and the second terminal;
   a control module adapted for opening and closing the first to the fourth switches in accordance with a pre-established sequence; and
   a calculating module adapted for calculating an isolation resistance between the positive high-voltage bus and the low-voltage ground, and an isolation resistance between the negative high-voltage bus and the low-voltage ground, based on voltage measurements at the first measurement resistance, and voltage measurements of the battery.

2. The device according to claim 1, wherein the control module is additionally adapted to set the device in a first measurement position where the first switch is open, the second switch is open, the third switch is closed, and the fourth switch is open, and wherein the calculating module is adapted to measure voltage at the first measuring resistance and voltage at the battery when in the first measurement position.

3. The device according to claim 2, wherein the control module is additionally adapted to set the device in a second measurement position where the first switch is closed, the second switch is open, the third switch is closed, and the fourth switch is open, and wherein the calculating module is adapted to measure voltage at the first measuring resistance and voltage of the high-voltage battery when in the second measurement position.

4. The device according to claim 3, wherein the control module is additionally adapted to set the device in a third measurement position where the first switch is open, the second switch is open, the third switch is open, and the fourth switch is closed, and wherein the calculating module is adapted to measure voltage at the first measuring resistance and voltage of the battery when in the third measurement position.

5. The device according to claim 4, wherein the control module is additionally adapted to set the device in a fourth measurement position where the first switch is open, the second switch is closed, the third switch is open, and the fourth switch is closed, and wherein the calculating module is adapted to measure voltage at the first measuring resistance and voltage of the battery when in the fourth measurement position.

6. The device according to claim 5, wherein the calculating module is additionally adapted to calculate the mean value of the four high-voltage battery voltage measurements taken in measurements positions one to four.

7. The device according to claim 5, wherein the calculating module is additionally adapted to calculate the isolation resistances of the battery powered system in accordance with the formulas:

$$\text{Riso\_pos} = \frac{R0 \cdot Rbottom \cdot |V1 - V1p|}{(Rtop + Rbottom) \cdot V1 \cdot V1p} \cdot \text{V\_HV\_mean}$$

$$\text{Riso\_neg} = \frac{R0 \cdot Rbottom \cdot |V2 - V2p|}{(Rtop + Rbottom) \cdot V2 \cdot V2p} \cdot \text{V\_HV\_mean}$$

and wherein V_HV_mean is the mean value of the four high-voltage battery voltage measurements taken in measurements positions one to four, V2 is the voltage at the first measuring resistance measured at the first measuring position, V2p is the voltage at the first measuring resistance measured at the second measuring position, V1 is the voltage at the first measuring resistance measured at the third measuring position, and V1p is the voltage at the first measuring resistance measured at the fourth measuring position.

8. The device according to claim 1, wherein the control module is additionally adapted to set the device in a second measurement position where the first switch is closed, the second switch is open, the third switch is closed, and the fourth switch is open, and wherein the calculating module is adapted to measure voltage at the first measuring resistance and voltage of the battery when in the second measurement position.

9. The device according to claim 1, wherein the control module is additionally adapted to set the device in a third measurement position where the first switch is open, the second switch is open, the third switch is open, and the fourth switch is closed, and wherein the calculating module is adapted to measure voltage at the first measuring resistance, and voltage of the battery when in the third measurement position.

10. The device according to claim 1, wherein the control module is additionally adapted to set the device in a fourth measurement position where the first switch is open, the second switch is closed, the third switch is open, and the fourth switch is closed, and wherein the calculating module is adapted to measure voltage at the first measuring resistance and voltage of the battery when in the fourth measurement position.

11. The device according to claim 1, wherein the calculating module is additionally adapted to calculate the mean value of the four high-voltage battery voltage measurements, taken in measurements positions one to four.

12. The device according to claim 1, wherein the calculating module is additionally adapted to calculate the isolation resistances of the battery powered system in accordance with the formulas:

$$\text{Riso\_pos} = \frac{R0 \cdot Rbottom \cdot |V1 - V1p|}{(Rtop + Rbottom) \cdot V1 \cdot V1p} \cdot \text{V\_HV\_mean}$$

$$\text{Riso\_neg} = \frac{R0 \cdot Rbottom \cdot |V2 - V2p|}{(Rtop + Rbottom) \cdot V2 \cdot V2p} \cdot \text{V\_HV\_mean}$$

and wherein V_HV_mean is the mean value of the four high-voltage battery voltage measurements taken in measurements positions one to four, V2 is the voltage at the first measuring resistance measured at the first measuring position, V2p is the voltage at the first measuring resistance measured at the second measuring position, V1 is the voltage at the first measuring resistance measured at the third measuring position, and V1p is the voltage at the first measuring resistance measured at the fourth measuring position.

13. An electric vehicle comprising:
a vehicle chassis including a low voltage ground;
a battery including a positive pole and a negative pole;
a device load (4); and
a device including a positive high-voltage bus connectable to the positive pole and to the device load, a negative high-voltage bus connectable to the negative pole and to the device load, a low-voltage ground connection, a first reference resistance and a first switch connected in series between the positive high-voltage bus and the low-voltage ground connection, a second reference resistance and a second switch connected in series between the negative high-voltage bus and the low-voltage ground connection, a first measurement resistance having a first terminal connected with the low-voltage ground connection and a second terminal, a second measurement resistance and a third switch connected in series between the positive high-voltage bus and the second terminal, a third measurement resistance and a fourth switch connected in series between the negative high-voltage bus and the second terminal, a control module adapted for opening and closing the first to the fourth switches in accordance with a pre-established sequence, and a calculating module adapted for calculating an isolation resistance between the positive high-voltage bus and the low-voltage ground and an isolation resistance between the negative high-voltage bus and the low-voltage ground based on voltage measurements at the first measurement resistance and voltage measurements of the high-voltage battery, wherein the positive high-voltage bus and the negative high-voltage bus are connected with the battery and with the device load.

14. A method for measuring isolation resistance of a battery powered system including a high-voltage battery, a load, a positive high-voltage bus, a negative high-voltage bus connected between the high-voltage battery and the load, and a low-voltage ground connection, the method comprising the steps of:
in a first measurement position, connecting a first and a second measurement resistance in series between the positive high-voltage bus and the low-voltage ground connection, and measuring voltage at the first measuring resistance, and voltage of the high-voltage battery;

in a second measurement position, additionally to the first measurement position, connecting a first reference resistance between the positive high-voltage bus and the low-voltage ground connection, and measuring voltage at the first measuring resistance, and voltage of the high-voltage battery;

in a third measurement position, connecting a first and a third measurement resistance in series between the negative high-voltage bus and the low-voltage ground connection, and measuring voltage at the first measuring resistance, and voltage of the high-voltage battery; and in a fourth measurement position, additionally to the third measurement position, connecting a second reference resistance between the negative high-voltage bus and the low-voltage ground connection, and measuring voltage at the first measuring resistance, and voltage of the high-voltage battery.

15. The method according to claim 14, further comprising the step of:

calculating the mean value of the four high-voltage battery voltage measurements taken in measurements positions one to four.

16. The method according to claim 14, further comprising the steps of:

calculating isolation resistances of the battery powered system in according with the formulas:

$$\mathrm{Riso\_pos} = \frac{R0 \cdot Rbottom \cdot |V1 - V1p|}{(Rtop + Rbottom) \cdot V1 \cdot V1p} \cdot \mathrm{V\_HV\_mean}$$

$$\mathrm{Riso\_neg} = \frac{R0 \cdot Rbottom \cdot |V2 - V2p|}{(Rtop + Rbottom) \cdot V2 \cdot V2p} \cdot \mathrm{V\_HV\_mean}$$

wherein V_HV_mean is the mean value of the four positive high-voltage bus voltage measurements taken in measurements positions one to four, V2 is the voltage at the first measuring resistance measured at the first measuring position, V2$p$ is the voltage at the first measuring resistance measured at the second measuring position, V1 is the voltage at the first measuring resistance measured at the third measuring position, and V1$p$ is the voltage at the first measuring resistance measured at the fourth measuring position.

* * * * *